USOO5637916A

United States Patent [19]
Joshi

[11] Patent Number: 5,637,916
[45] Date of Patent: Jun. 10, 1997

[54] CARRIER BASED IC PACKAGING ARRANGEMENT

[75] Inventor: Rajeev Joshi, Cupertino, Calif.

[73] Assignee: National Semiconductor Corporation, Santa Clara, Calif.

[21] Appl. No.: 596,434

[22] Filed: Feb. 2, 1996

[51] Int. Cl.⁶ .................................................. H01L 23/495
[52] U.S. Cl. ........................ 257/668; 257/701; 257/685; 257/723; 257/787
[58] Field of Search .................................... 257/668, 701, 257/787, 685, 723

[56] References Cited

U.S. PATENT DOCUMENTS 5,293,067  3/1994  Thompson et al. .................. 257/668
5,355,016  10/1994  Swirbel et al. ...................... 257/659

OTHER PUBLICATIONS

Howard Markstein, *"Thermal Enhancements For TQFPs,"* Electronic Packaging & Production, Silicon Systems, Tustin, California.

Primary Examiner—Sara W. Crane
Assistant Examiner—Roy Potter
Attorney, Agent, or Firm—Hickman Beyer & Weaver

[57] ABSTRACT

The present invention discloses the use of a dielectric substrate panel suitable for supporting a plurality of independently packaged ICs. The substrate panel has a plurality of conductive landings arranged on its top surface, a plurality of conductive contacts arranged on its bottom surface and a multiplicity of electrically conductive vias. The vias pass through the substrate panel and are arranged to interconnect selected landings with their associated conductive contacts. The top surface of the substrate panel also includes a number of die attach areas. During packaging, dies are secured to their associated die attach areas on the substrate panel and electrically coupled to appropriate conductive landings. An encapsulant is then formed over each of the dies for protection.

13 Claims, 8 Drawing Sheets

CARRIER BASED IC PACKAGING ARRANGEMENT

BACKGROUND OF THE INVENTION

The present invention relates generally to the packaging of integrated circuits. More particularly, the invention relates to methods and apparatuses for packaging integrated circuits using a carrier that supports a multiplicity of dies and packaged integrated circuits formed therefrom.

Packaging semiconductors is a vital aspect of semiconductor manufacturing. Although there are many types of packaging configurations available, many improvements are still needed to simplify the package fabrication process. By way of example, many of today's packaging techniques are accomplished by packaging one integrated circuit chip at a time. As a consequence, manufacturing resources are inefficiently utilized which unfortunately has a direct correlation to increased packaging costs.

Another problem with current technology packaging configurations is size. For years there has been a growing demand to miniaturize integrated circuit chips. Although there have been many advancements which have generated smaller integrated circuit chips, the reduction in chip packaging has lagged behind.

An example of a well known packaging technique is shown in FIG. 1A. FIG. 1A shows an integrated circuit chip package 100 having a die 104 mounted on a conventional die attach pad 102. After die 104 is secured to die attach pad 102, a wire bonder is used to interconnect a plurality of wire bonds 106 between die 104 and a plurality of leadframe leads 110. For ease of illustration, only two leads and wire bonds are shown, but as is well known in the art, many more leads 110 and wire bonds 106 are used to provide appropriate die-to-lead interconnection. Once the appropriate interconnections are in place, the entire die and interconnections are encased in an encapsulating material 108. Typical encasing processes include injecting encapsulating material 108 (e.g., molten plastic) into a transfer mold.

As can be appreciated, the overall size of integrated circuit chip package 100 is substantially larger than die 104. In addition, the required fabrication processes involved in serially packaging each integrated circuit chip may be relatively time consuming when large quantities are desired.

In another example, FIGS. 1B–1D illustrate one type of hermetically sealed integrated circuit chip package. Referring first to FIG. 1B, an integrated circuit chip package 120 is shown in a cross-sectional view. The integrated circuit chip package 120 includes a multi-leveled base portion 124 and a lid portion 122. Attached to base portion 124 is a die 104, which is typically affixed to a die attach pad 105. Conventional methods of attaching die 104 include, for example, adhesive epoxies. Once die 104 is attached, a plurality of bonding wires 106 provide electrical connection between die 104 and a plurality of bonding shelves 107. From bonding shelves 107, a conductive lead provides the necessary connection to a plurality of castellations 128. Castellations 128 are defined by conductive half cylindrical surfaces and are formed around base portion 124.

FIG. 1C is a side view of integrated circuit chip package 120 after lid portion 122 has been hermetically sealed to base portion 124. As mentioned above, castellations 128 are conductive half cylindrical surfaces, and are designed to provide electrical interconnection to a bottom portion 127. FIG. 1D is a bottom view of integrated circuit chip package 120 having a plurality of contacts 132. Each contact 132 is coupled to an associated castellation 128.

Although integrated circuit chip package 120 eliminates the need for leads 110 of FIG. 1A, and reduces overall package size, the packaging size (e.g., vertical height) is still substantially larger than appropriate for some applications. A further disadvantage with fabricating multi-level integrated circuit packaging structures (i.e., different levels for a die attach pad, a bond pad and a lid) is the need for additional fabrication equipment to generate each level. Consequently, fabricating large quantities of multi-level integrated circuits may be far more expensive as compared to the benefits obtained from reducing the packaging size.

Another type of integrated circuit packaging is called a chip scale package (CSP). This type of packaging is called a CSP since the size of the package is about size the integrated circuit chip (e.g., die). Currently, there are a wide variety of CSPs available, although most require multiple package levels. Examples include a mini-Ball Grid Array (BGA), and a micro-Ball Grid Array (µBGA).

For illustration purposes, FIG. 1E shows a simplified CSP grid array (GA) package 140 having a dielectric interposer 144 and an integrated circuit chip die 104 that is about the size of the package 140. Between integrated circuit chip die 104 and interposer 144 is an underfill epoxy 142. In this example, the appropriate electrical interconnections between integrated circuit chip 104 and an array of solder balls 146 is made through a number of electrical traces (not shown) constructed through underfill epoxy 142. Although CSP GA designs have been successful in decreasing packaging size, each multi-level integrated circuit must still be packaged individually. Therefore, mass producing GAs tends to be expensive, time consuming and require additional fabrication steps.

In view of the foregoing, there is a need for low cost integrated circuit chip packages that can be fabricated using conventional fabrication equipment and can be mass produced without consuming too many resources to be cost effective.

SUMMARY OF THE INVENTION

To achieve the foregoing and other objects and in accordance with the purpose of the present invention, the use of a dielectric substrate panel suitable for supporting a plurality of independently packaged ICs is disclosed. The substrate panel has a plurality of conductive landings arranged on its top surface, a plurality of conductive contacts arranged on its bottom surface and a multiplicity of electrically conductive vias. The vias pass through the substrate panel and are arranged to interconnect selected landings with their associated conductive contacts. The top surface of the substrate panel also includes a number of die attach areas. During packaging, dies are secured to their associated die attach areas on the substrate panel and electrically coupled to appropriate conductive landings. An encapsulant is then formed over each of the dies for protection.

In one embodiment of the present invention, the vias are arranged in an array of columns and rows and selected single vias are used to electrically couple two distinct dies to a particular conductive contact. In this manner, when the array of packaged integrated circuits is partitioned, the selected vias are each divided into two castellations. Therefore, the conductive contacts associated with the selected vias are divided into two conductive contacts. Each conductive contact being electrically connected to an associated conductive landing through its associated castellation.

DETAILED DESCRIPTION OF THE PREFERRED EMBODIMENTS

FIGS. 1A–1E, as described above, illustrate some conventional integrated circuit (IC) chip packaging configurations having reduced package size. However, there is still a great demand for even smaller package sizes and simplified manufacturing processes that are more cost efficient. In one embodiment, the present invention provides a method for manufacturing large arrays of IC chips using single-level multi-chip substrate panels. A significant advantage of the present invention is that standard fabrication equipment may be used to perform the various fabrication steps described below. This eliminates the high costs associated in purchasing specialized fabrication equipment. Furthermore, there are significant cost advantages associated with packaging IC chips on a single layer substrate carrier as opposed to multi-level substrates carriers which typically require additional carrier fabrication steps.

In general, the present invention contemplates the use of a dielectric substrate panel suitable for supporting a plurality of independently packaged ICs during the packaging process. The substrate panel has a plurality of conductive landings arranged on its top surface, a plurality of conductive contacts arranged on its bottom surface and a multiplicity of electrically conductive vias. The vias pass through the substrate panel and are arranged to interconnect selected landing with their associated conductive contacts. Typically, the substrate panel vias are arranged in an array having a plurality of columns and rows throughout the substrate panel. The conductive landings and contacts may be formed using any suitable process such as patterned metallization. The metallization may also be used to coat the inner walls of the vias. The patterned metallization is also configured such that conductive contacts are defined on the bottom surface and the inner walls of the array of vias are conductively coated. A plurality of IC chips are attached to the top surface of the substrate panel and the IC chips are interconnected to the conductive landings. An encapsulant then covers each IC chip and associated interconnections. In this manner, a plurality of IC chips are individually packaged on large multi-chip substrate panels. The panels may then be partitioned to form individually packaged IC chips.

Figure 1A:
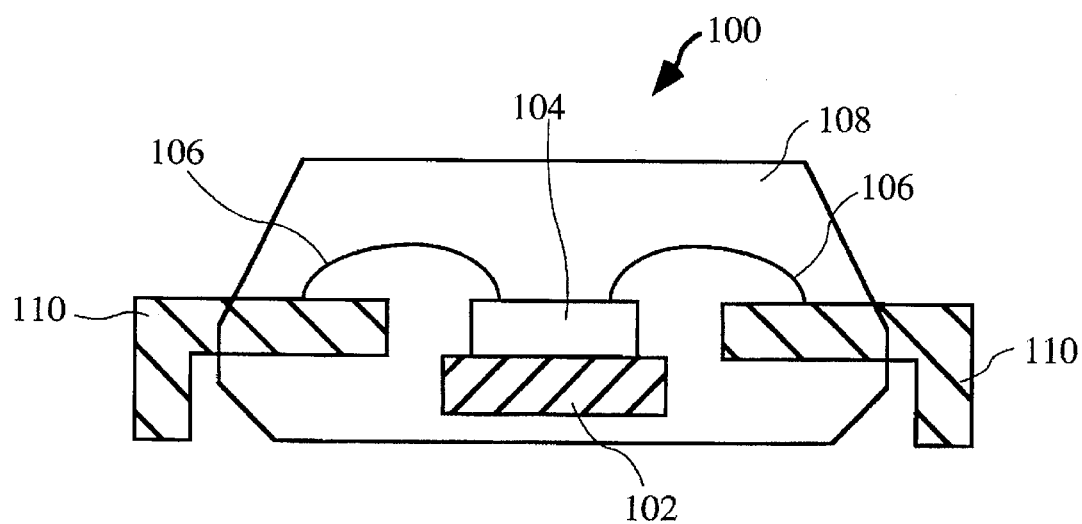
FIG. 1A is a diagrammatic cross-sectional view of a conventional plastic encapsulated leadframe based integrated circuit.
Figure 1B:
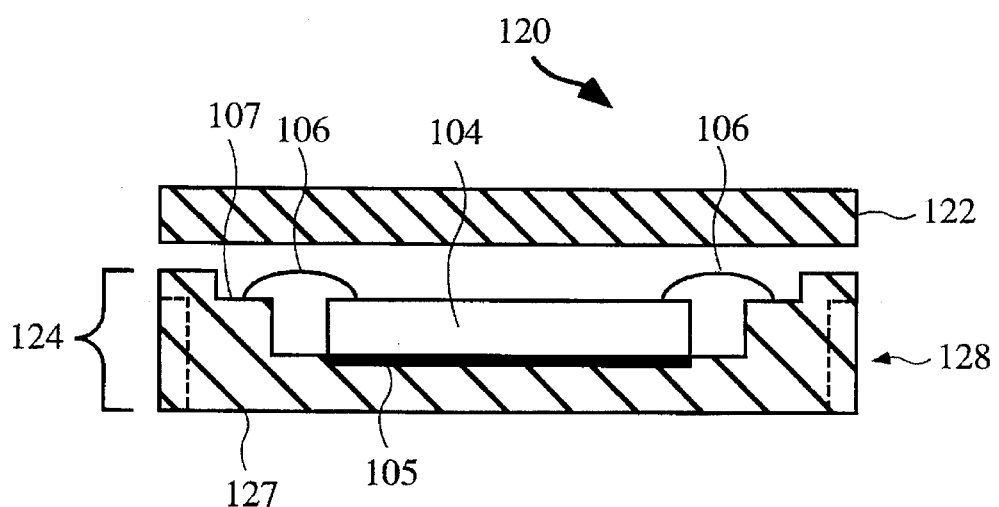
FIG. 1B is a cross-sectional view of a conventional multi-level hermetically sealed integrated circuit chip package.
Figure 1C:
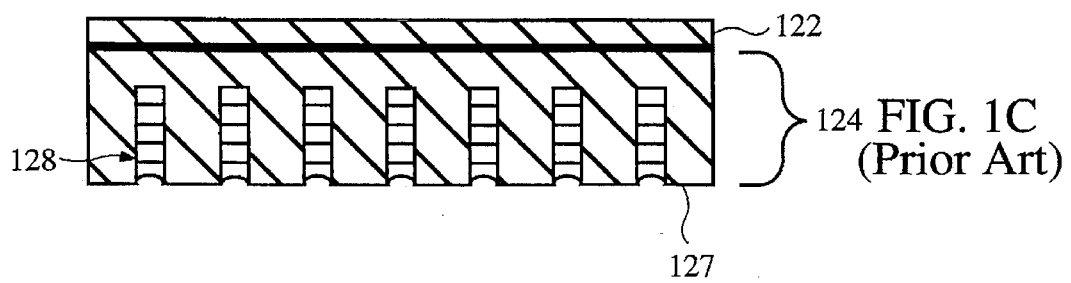
FIG. 1C is a side view of the multi-level hermetically sealed integrated circuit chip package described in FIG. 1B.
Figure 1D:
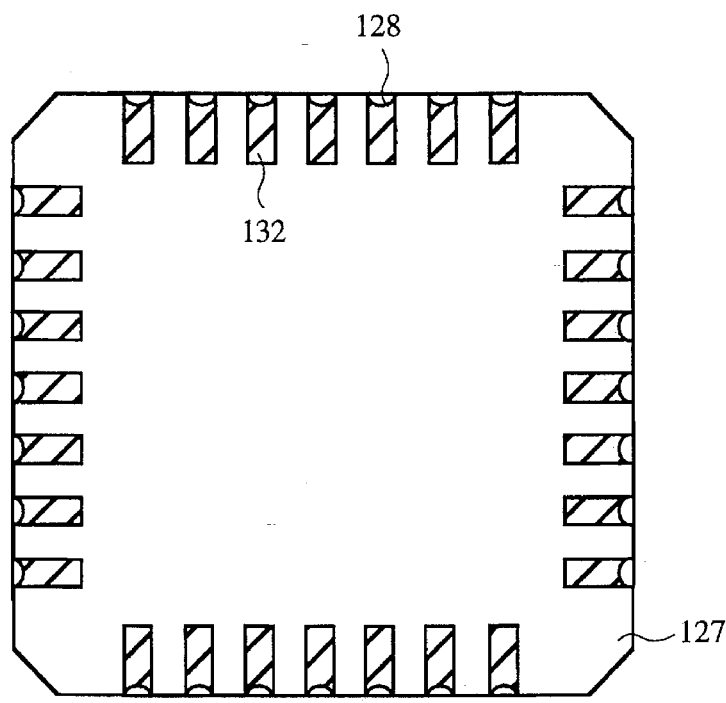
FIG. 1D is a bottom view of the multi-level hermetically sealed integrated circuit chip package described in FIG. 1B.
Figure 1E:
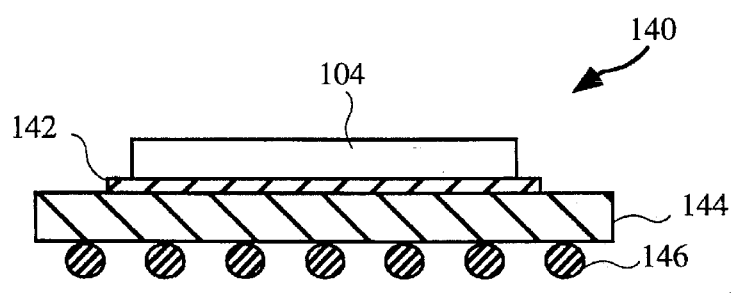
FIG. 1E is a simplified illustration of a conventional ball grid array (BGA).
Figure 2:
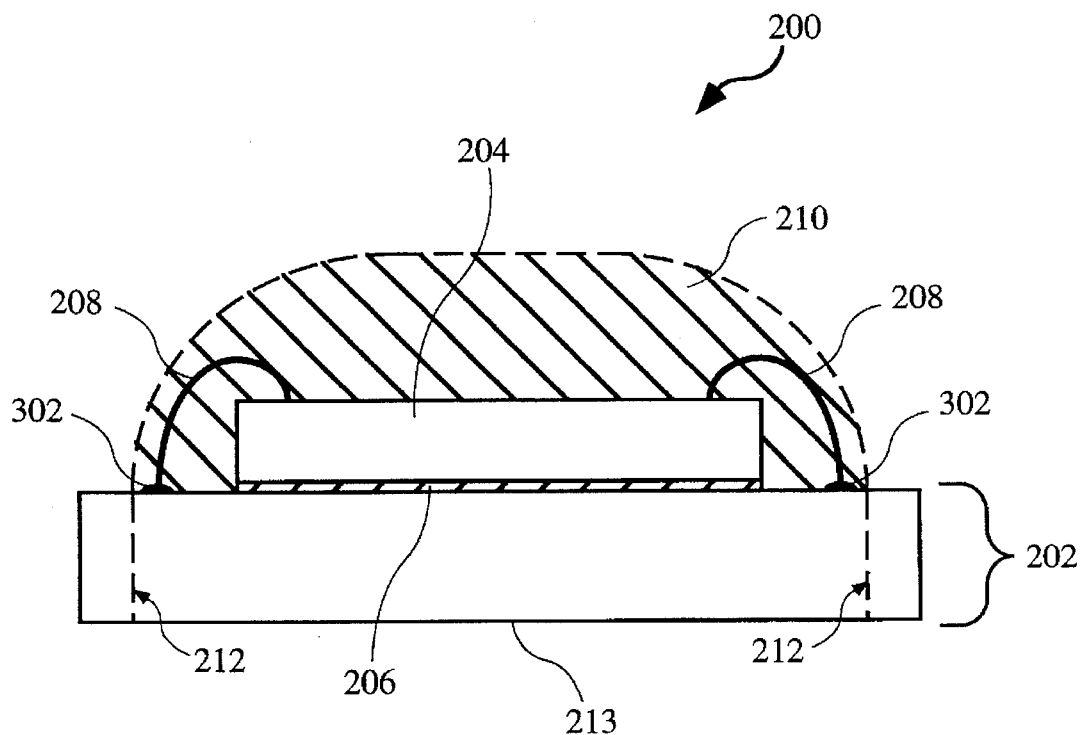
FIG. 2 is a cross-sectional view of a packaged integrated circuit in accordance with one embodiment of present invention.

FIG. 2 is a cross-sectional view of a packaged IC chip 200 of the present invention. For ease of explanation, FIG. 2 will be limited to describing the fabrication steps associated with packaging a single IC chip. However, it should be understood that the fabrication process is directed at packaging arrays of IC chips on multi-chip substrate panels. Therefore, a substrate 202 represents one substrate segment (e.g., suitable for packaging a single IC chip) that was part of a larger substrate panel. The substrate 202 may be formed from any suitable dielectric material. By way of example, one suitable substrate may be a single layer active metal (SLAM) ceramic sheet (e.g., alumina substrate).

In this embodiment, an IC chip 204 is attached to a die attach area (not shown for ease of illustration) on substrate 202. Although any suitable attaching method may be used, one exemplary method of attaching IC chip 204 to substrate 202 includes applying a conductive epoxy 206 directly to the die attach area. Once IC chip 204 is attached to substrate 202, a plurality of bonding wires 208 connect IC chip 204 to a plurality of conductive landings 302, which are patterned on the top surface of substrate 202. Although the use of wire bonds is specifically described, it should be understood that other methods of providing interconnection between IC chip 204 and substrate 202 may be used. Example interconnection methods include, tape automated bonding (TAB), directly attaching die contacts to carrier surfaces (e.g., via flip-chip wafer bumps), Z axis conductive epoxies, etc.

The plurality of conductive landings 302 are generally applied by patterning a conductive material directly to the surface of substrate 202. In this embodiment, prior to patterning the conductive material, an array of vias, arranged in an array of columns and rows are punched through a substrate panel. In this manner, when the conductive material is applied, the conductive material coats the inner walls of each via. Therefore, once IC chip 204 is wire bonded to conductive landings 302, each conductive landing is electrically coupled to an associated via. In this embodiment, substrate 202 has been partitioned along a scribe line defined by columns of vias such that substrate 202 has a series of half vias. The half vias define a series of castellations 212. Each castellation 212 is designed to provide electrical connection between an associated conductive landing 302 and an associated conductive contacts on a bottom side 213 of substrate 202.

After the appropriate IC chip 204 interconnections are in place, any suitable encapsulating material 210 may be applied over IC chip 204 and the array of bonding wires 208 to protect the die. By way of example, suitable encapsulating materials 210 may include a glob-top epoxy, a polyimide, or a mold compound which should be adhesive enough to freeze the array of bonding wires 208 in place. The encapsulating materials 210 should be electrically non-conductive to prevent short circuits between the array of bonding wires 208. As will be appreciated by those skilled in the art, in many cases, it may be desirable to include a flame retardant in the encapsulating material. Although a few encapsulating materials are specifically mentioned, it should be understood that other suitable materials may be substituted therefor.

At this point, the packaging process is complete for one IC chip 204. However, as mentioned above, FIG. 2 is only an example of a packaged IC chip after it has been partitioned from a large array of packaged IC chips. Therefore, in one preferred embodiment, IC chips are not packaged individually, but are packaged as large arrays of IC chips (e.g., on large substrate panels). In this manner, each step of the packaging process is completed on the entire substrate panel before the next packaging step is performed. Accordingly, when each IC chip in the array has been encapsulated with encapsulating material 210, the array of IC chips is partitioned into individually packaged IC chips (e.g., packaged IC chip shown in FIG. 2).

The vertical height of a packaged IC chip may be widely varied in accordance with the needs of a particular design. By way of example, the vertical height of a packaged IC chip may range between approximately 30 mils and approximately 60 mils. In a specific example, the height may be about 40 mils (e.g., about 1 millimeter). Included in the vertical height of a packaged IC chip is the thickness of substrate 202. The thickness of substrate 202 may also vary widely according to the needs of a particular design and substrate material used. By way of example, substrate 202 may have a thickness ranging between approximately 5 mils and approximately 25 mils. In one embodiment, the thickness may be about 15 mils.

Packaging ICs having the aforementioned range of heights is relatively low as compared to some current technology chip scale packaged (CSP) integrated circuits, the packaged IC chip of the present invention provides improved parasitics due to the shorter vertical bond wire lengths. In addition, the thermal performance (θjc) of packaged IC chips of the present invention is typically better than comparable surface mount plastic packages.

Figure 3:
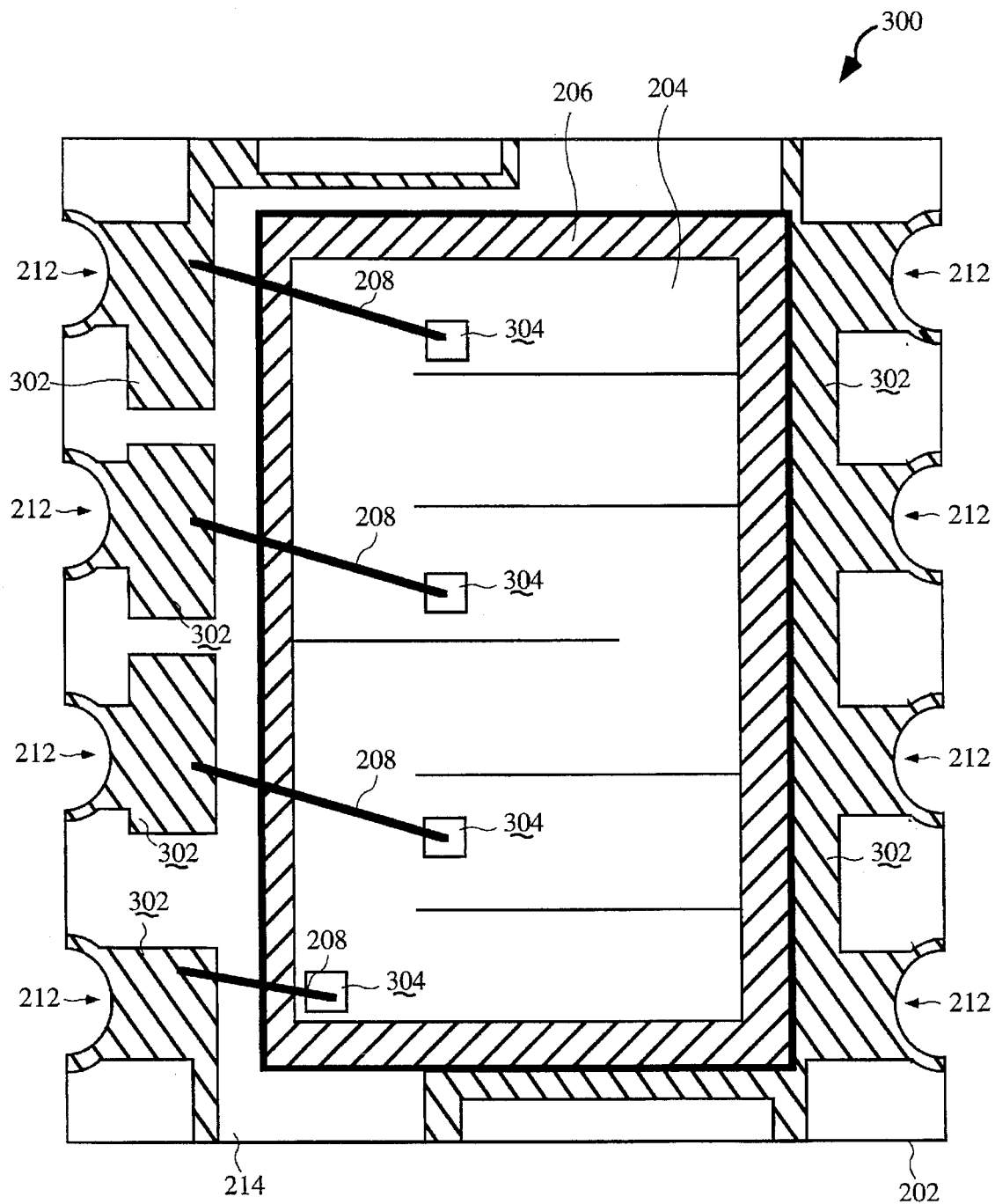
FIG. 3 is a top view of a partitioned carrier with a single die mounted thereon prior to encapsulation.

Turning to FIG. 3, a partitioned carrier segment 300 suitable for packaging a single die is shown. For ease of illustration, encapsulating material 210 is not shown. Substrate 202, as described above, is a partitioned segment of a larger substrate panel, and castellations 212 are clearly shown to be associated with a specific conductive landing 302. Each conductive landing 302 may be interconnected to contact pad 304 on IC chip 204 by any suitable interconnecting structure. By way of example, a suitable interconnecting structure may include wire bonding. In addition, it should be understood that any number of wire bonds and bonding pads may be implemented to provide appropriate IC interconnections.

IC chip 204 is also shown attached to substrate 202 by conductive epoxy 206. In this example, IC chip 204 is placed on substrate 202 such that one side of IC chip 204 is wire bonded to conductive landings 302 and the bottom surface of the other side of IC chip 204 is in conductive contact with conductive landings 302. As mentioned above, IC chip 204 is attached to substrate 202 by way of conductive epoxy which provides the electrical contact between IC chip 204 and conductive landings 302.

The conductive landings 302 are generally designed to have a wide variety of metallization patterns. The metallization patterns are generally chosen to provide a customized interconnection between an IC and associated conductive landings. By way of example, conductive landings 302 have been patterned to provide a customized interconnection to IC chip 204. Accordingly, a variety of customized conductive landings may be patterned for other integrated circuits. Sample integrated circuits may include application specific integrated circuits (ASICs), high speed static random access memories (SRAMs), dynamic random access memories (DRAMs), analog to digital (A/D) converters, low lead count logic circuits, micro-controllers, etc. In addition, the actual size of IC chip 204 may also vary depending on the particular integrated circuit being implemented.

Figure 4:
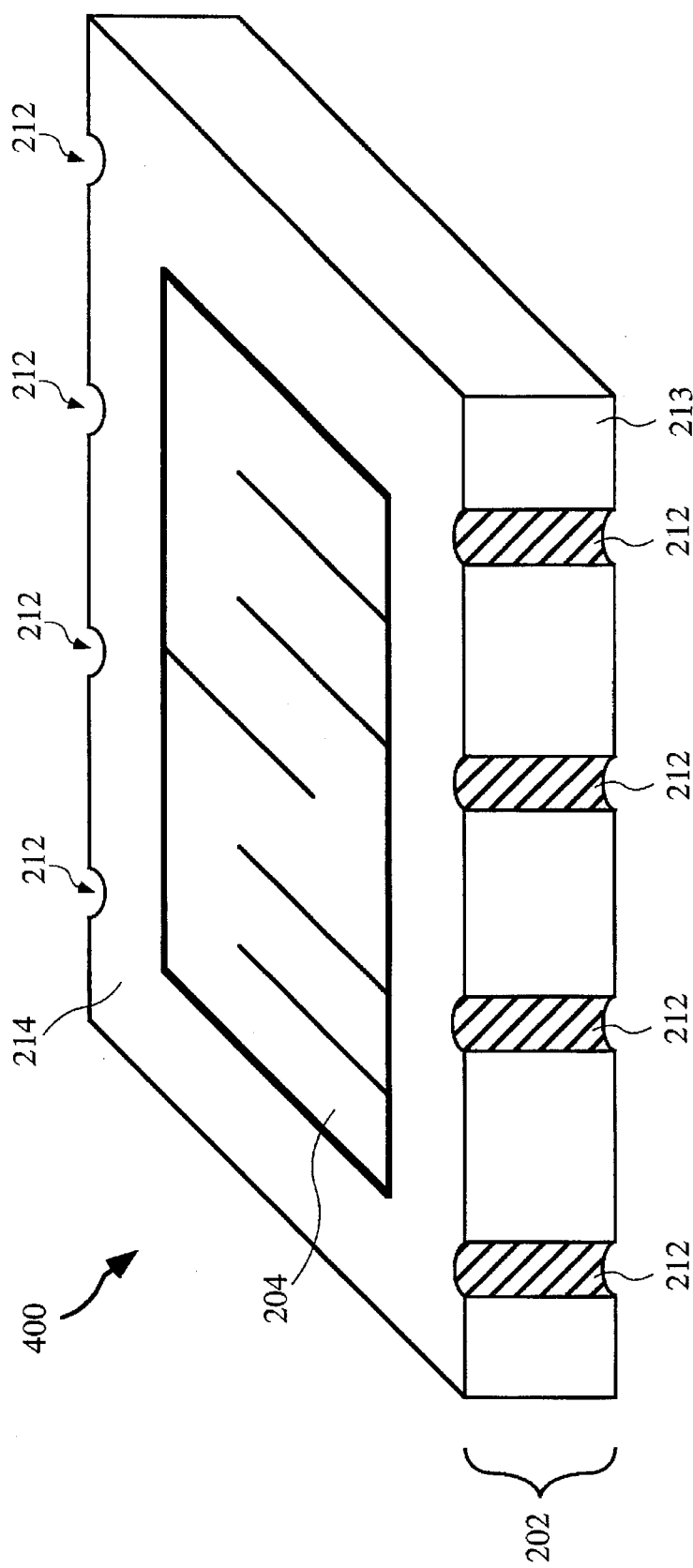
FIG. 4 is a side view of a partitioned carrier for a single die showing a plurality of conductively coated castellations in accordance with one embodiment of the present invention.

FIG. 4 is a side view 400 of substrate 202 showing a detailed perspective of castellations 212. The patterned conductive landings 302 and wire bonds 208 described in FIG. 3 are not shown here in order to facilitate the description of castellations 212. As mentioned above, each castellation 212 may be coated with any suitable conductive material. By way of example, suitable conductive materials include patterned gold, aluminum, copper, palladium, silver, etc. (or any combination thereof). The patterned conductive material are applied to substrate 202 while it is still in panel form. In this manner, the inner walls of each via is coated with the conductive material prior to the partitioning process. Therefore, each via actually represents two castellations after partitioning, and each castellation 212 is electrically coupled to an associated conductive landing 302 on a top surface 214 of substrate 202. In some embodiments, conductive landings on substrate 202 may be patterned to be electrically coupled to more than one castellation 212.

Once IC chip 204 is attached to substrate 202 and the necessary interconnections are in place, electrical conduction may be established between conductive landings 302 on top surface 214 and conductive contacts on bottom surface 213. Bottom surface 213 is provided with a plurality of conductive contacts (i.e., 602 of FIG. 6) patterned around each castellation 212. In practice, a packaged IC chip 204 may be installed onto a printed circuit board such that any necessary electrical signals going into IC chip 204 is first transmitted to the conductive contacts on bottom surface 213, and then transmitted through castellations 212 and onto conductive landings 302. From conductive landings 302, the signal is transferred to the encapsulated interconnections and onto conductive contacts 304 (i.e., conductive contacts 304 of FIG. 3) on IC chip 204.

Although only eight castellations 212 are shown associated with one IC chip 204, it should be understood that some IC chips require more or less castellations. In such case, appropriate modifications may be made when designing the via layout on a substrate panel. By way of example, metallized castellations 212 may be formed on every side or selected sides of a substrate segment. In addition, each castellation 212 may be defined by other shapes other than the cylindrical shape shown. For example, some castellations may be rectangular in shape, etc.

Figure 5:
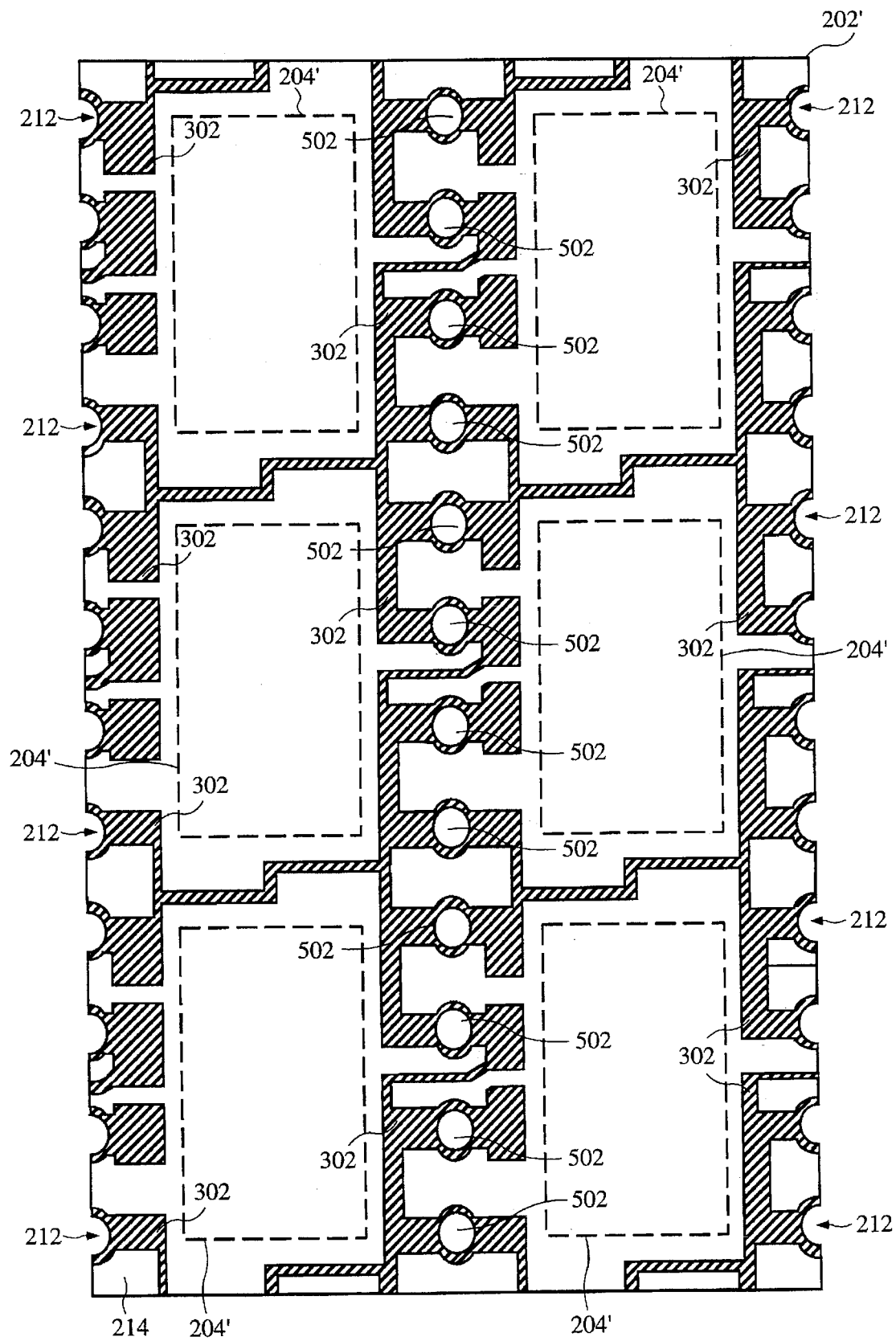
FIG. 5 illustrates an un-partitioned substrate panel having patterned conductive landings and a plurality of castellations in accordance with one embodiment of the present invention.

As mentioned above, substrate segment 202 represents only one segment of a larger substrate panel. FIG. 5 shows an un-partitioned substrate panel 202' having a pattern of conductive landings 302 and a plurality of castellations 212 in accordance with one embodiment of the present invention. Once rows and columns of vias 502 are punched into substrate panel 202', top surface 214 is patterned with conductive material to form a network of conductive landings 302. As described above, the conductive material is applied in such a manner that the inner walls of each via is conductively coated. Of course, once substrate panel 202' is partitioned along vias 502, each via 502 will form two castellations 212.

For manufacturing efficiency, each IC chip is attached to substrate panel 202' before partitioning. For example, once conductive landings 302 have been patterned on substrate panel 202', IC chips 204 are attached to each die attach area 204'. Then appropriate bonding wires 208 are connected between IC chip 204 and conductive landings 302 for each IC chip attached to substrate panel 202'. After the necessary interconnections have been completed, encapsulant 210 is applied over each IC chip attached to substrate panel 202'. At this point, if an identifying marking is desired, each packaged IC chip on substrate panel 202' is marked. Next, each IC chip is tested to determine if performance characteristics are as anticipated. Finally, each packaged IC chip is partitioned into a multiplicity of individually packaged IC chips. As can be appreciated, packaging a multiplicity of IC chips on a large substrate panel is very cost efficient.

Figure 6:
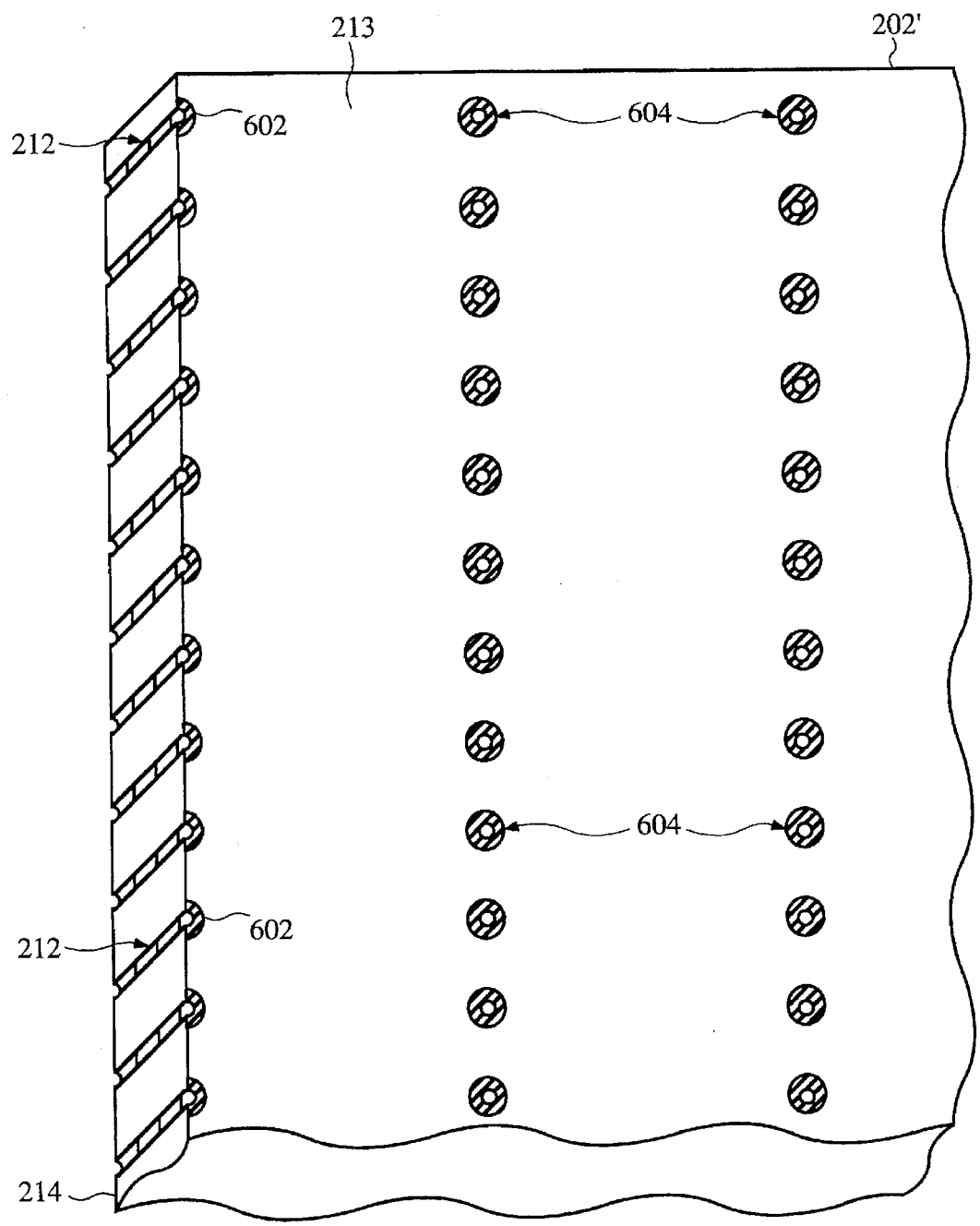
FIG. 6 is a bottom surface perspective of an un-partitioned substrate panel in accordance with one embodiment of the present invention.

Turning now to FIG. 6, a bottom surface 213 perspective of un-partitioned substrate panel 202' is illustrated. In this embodiment, a side view of castellations 212 is provided to illustrate how castellations 212 are electrically connected to an associated conductive contact 602. Further, each conductive contact 602 is shown as a conductively coated half circular ring. However, before substrate panel 202' is partitioned into individually packaged IC chips, each conductive contact may be patterned in a wide variety of geometric shapes depending on the particular design. By way of example, conductive contacts may be patterned as conductively coated full circular ring contacts 604.

Figure 7:
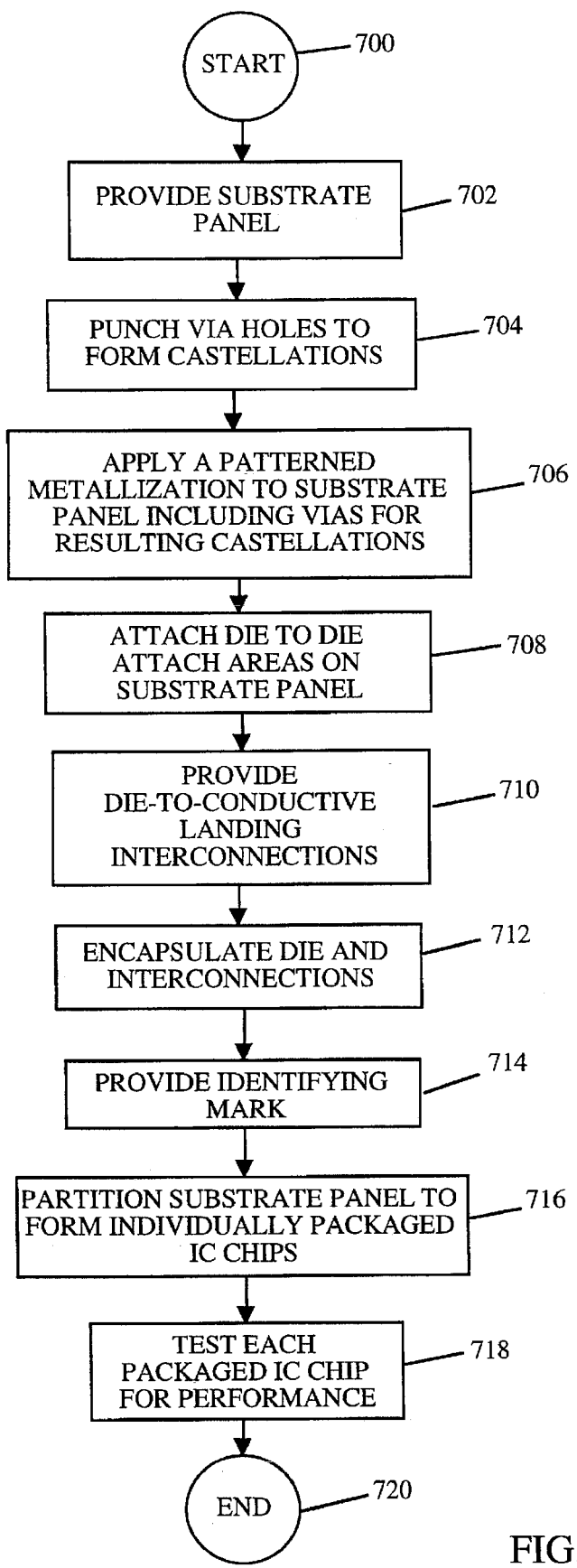
FIG. 7 is a flowchart representing one preferred method of packaging integrated circuit chip in accordance with the present invention.

The above-described manufacturing steps may be further understood with reference to a flowchart presented in FIG. 7. The process starts at a step 700. From step 700, the method proceeds to a step 702 where a substrate panel is provided (e.g., substrate panel 202' of FIG. 5). As mentioned above, any suitable dielectric material substrate panel may be provided. By way of example, one suitable substrate panel may be a single layer active metal (SLAM) ceramic sheet (e.g., alumina substrate). After a suitable substrate panel has been provided, the method proceeds to a step 704 where vias are punched through the substrate panel provided in step 702. In one embodiment, vias are punched throughout the substrate panel such that an array of via columns and rows are formed.

In step 706, a patterned metallization layer is applied to the substrate panel provided in step 702 such that a plurality of conductive landings are formed. As mentioned above, the conductive landings are generally designed to have a wide variety of metallization patterns. The metallization patterns are typically chosen to provide customized interconnections between conductive landings and associated ICs. In addition, the metallization material should be applied such that each via inner wall is covered with an appropriate amount of metallization. In this manner, when the substrate panel is partitioned, the resulting castellations provide proper electrical conduction between respective patterned conductive landings and associated conductive contacts.

The method then proceeds to a step 708 where a die is affixed to each die attach area. The affixing process may be performed by implementing any number of well known die attach tools. In this manner, a die attach tool affixes a die to an attach area by applying any suitable adhesive material between the die attach area and the die being affixed. By way of example, suitable adhesive materials may include conductive epoxies. Once a die has been properly affixed to each die attach area on the substrate panel, the method proceeds to a step 710 where conductive interconnections are provided between each IC chip and associated conductive landings. There are many types of conductive interconnections, and any suitable interconnection may be implemented based on the needs of a particular design. By way of example, suitable interconnections may include wire bonding, tape automated bonding (TAB), directly attaching die contacts to carrier surfaces (e.g., via flip-chip wafer bumps), Z axis conductive epoxies, etc.

After all necessary interconnections are performed for each die in step 710, the method proceeds to a step 712 where each die and associated conductive interconnections are encapsulated with an encapsulating material. As mentioned above, suitable encapsulants may include a glob-topping, a polyimide, a mold compound or any other suitable non-conductive glue-type material which will functionally isolate and protect each interconnection. In one embodiment, a glob-topping encapsulant is applied over each IC chip affixed to the substrate panel. In practice, a glob-topping is individually applied over each IC chip on the substrate panel such that every IC chip has an adequate amount of encapsulating glob-top material.

In some cases, the glob-topping material of each IC chip may slightly seep into and merge with the glob-topping material of a neighboring IC chip. If this occurs, the encapsulating material merging between IC chips may have a tendency of creating a layer of encapsulating material over the entire substrate panel. In other cases, the glob-topping applied to individual IC chips may not merge into the glob-topping of neighboring IC chips. Therefore, some substrate panels may result with regions where the glob-topping has merged and regions where no merging has occurred. In any event, each IC on the substrate panel will be properly encapsulated.

After encapsulating step 712 is completed for each IC chip on the substrate panel, the method proceeds to a step 714 where an identifying mark may be applied to each IC chip. Identifying marks are typically used in the IC packaging industry to distinguished one packaged IC chip from another. Since the marking step is not a necessary step in the packaging process, marking may be performed on each IC chip before the substrate panel is partitioned, or alternatively may also be marked after the partitioning step (i.e., one packaged IC chip at a time).

Once the marking step is completed, the method proceeds to a step 716 where the substrate panel is partitioned into individually packaged IC chips. As described above, the partitioning may be performed along via columns such that each partitioned via forms two substantially symmetric castellations. Alternatively, the substrate panel may also be partitioned along scribe lines not defined along the array of columns and rows of vias. However, whether partitioning is performed along via columns or not, the partitioning step may be performed by implementing a wide variety of suitable apparatuses. By way of example, suitable apparatuses may include a roller, a saw, a laser, etc.

After the partitioning step of 716 is complete, the method proceeds to a step 718 where each packaged die is tested for performance characteristics. Although testing is described to take place after the partitioning step of 716, it should be understood that testing may also be performed before the partitioning step of 716.

There are many other advantages associated with packaging IC chips on a single level substrate. For example, there are generally fewer assembly steps associated in packaging ICs on single level substrates. Fewer assembly steps is advantageous in reducing the types of fabrication equipment necessary in the packaging process which translates to overall reduced costs. Therefore, packaging IC chips in an array format increases productivity and improves fabrication equipment efficiency.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. An array of packaged integrated circuits comprising:
   a dielectric substrate panel having top and bottom surfaces, a plurality of die attach areas on the top surface;
   a multiplicity of vias passing through the substrate panel, a plurality of conductive landings arranged on the top surface;
   a plurality of conductive contacts arranged on the bottom surface, each conductive landing being electrically connected to an associated conductive contact through metallization that passes through an associated one of the vias;
   a plurality of dies, each die being secured to an associated one of the die attach areas such that the multiplicity of vias are defined substantially between each of the plurality of dies;
   a plurality of conductors arranged to electrically couple the plurality of dies to associated ones of the plurality of conductive landings; and
   an encapsulant formed over each of the dies such that said encapsulant protects the plurality of dies and the plurality conductors.

2. An array of packaged integrated circuits as recited in claim 1 wherein the vias are arranged in an array of columns and rows and selected single vias are used to electrically couple two distinct dies to a particular conductive contact, such that after the array of packaged integrated circuits is partitioned to produce at least two partitioned integrated circuit chips, the selected vias are each divided into two castellations and the conductive contacts associated with the selected vias are divided into two conductive contacts, each conductive contact being electrically connected to an associated conductive landing through its associated castellation.

3. The array of packaged integrated circuits as recited in claim 2 wherein the substrate panel further comprises scribe lines aligned with the via columns.

4. The array of packaged integrated circuits as recited in claim 1 wherein the encapsulant is a glob-topping material.

5. The array of packaged integrated circuits as recited in claim 2 wherein each of the at least two partitioned integrated circuit chips have a vertical height in the range of approximately 30 mils to approximately 60 mils.

6. The array of packaged integrated circuits as recited in claim 1 wherein the plurality of conductors being selected from the group consisting essentially of wire bonds, wafer bumps, and Z axis conductive epoxy.

7. The array of packaged integrated circuits as recited in claim 2 wherein each of the at least two partitioned integrated circuit chips have a substrate thickness in the range of approximately 5 mils to approximately 25 mils.

8. An array of packaged integrated circuits as recited in claim 1, wherein a conductive adhesive material is used to electrically couple selected bond pads on the plurality of dies to associated conductive landings on the top surface of the substrate panel.

9. A integrated circuit packaging arrangement, comprising:
   a substrate panel having a top and a bottom surface, the substrate panel having a plurality of die attach areas defined on the top surface of the substrate;
   a multiplicity of conductively coated via holes defined around each of the die attach areas and extending between the top and bottom surfaces, and the via holes defining a partitioning location for dividing the substrate panel into a plurality of partitioned substrate carriers;
   a plurality of conductive landings being arranged on the top surface of the substrate panel, each of the conductive landings being in electrical contact with of the multiplicity of conductively coated via holes;
   a plurality of conductively coated contacts arranged on the bottom surface of the substrate panel and being electrically connected to associated conductive landings through associated ones of the multiplicity of conductively coated via holes;
   a plurality of dies, each die being secured to an associated one of the die attach areas such that the multiplicity of conductively coated via holes are located between each of the plurality of dies; and
   a plurality of bonding wires electrically coupling the plurality of dies to associated ones of the plurality of conductive landings.

10. A integrated circuit packaging arrangement as recited in claim 9, wherein an encapsulant formed over each of the dies protects the plurality of dies and the plurality bonding wires.

11. A integrated circuit packaging arrangement as recited in claim 10, wherein the encapsulant is a glob-topping material.

12. A integrated circuit packaging arrangement as recited in claim 11, wherein the substrate panel further comprises grid scribe lines at the bottom surface of the substrate panel, and each of the plurality of dies are bound by four grid scribe lines, and at least two of the four grid scribe lines are aligned with the via columns.

13. A integrated circuit packaging arrangement, comprising:
   a substrate panel having a top and a bottom surface, the substrate panel having a plurality of die attach areas defined on the top surface of the substrate;
   a multiplicity of conductively coated via holes defined around each of the die attach areas and extending between the top and bottom surfaces, and the via holes defining a partitioning location for dividing the substrate panel into a plurality of partitioned substrate carriers;
   a plurality of conductive landings being arranged on the top surface of the substrate panel, each of the conductive landings being in electrical contact with of the multiplicity of conductively coated via holes;
   a plurality of conductively coated contacts arranged on the bottom surface of the substrate panel and being electrically connected to associated conductive landings through associated ones of the multiplicity of conductively coated via holes;
   a plurality of dies, each die being secured to an associated one of the die attach areas such that the multiplicity of conductively coated via holes are located between each of the plurality of dies; and
   a conductive adhesive material being used to electrically couple selected bond pads on the plurality of dies to associated conductive landings on the top surface of the substrate panel.

* * * * *